US006831259B2

(12) United States Patent
Muegge et al.

(10) Patent No.: US 6,831,259 B2
(45) Date of Patent: Dec. 14, 2004

(54) APPARATUS FOR THE HEATING OF PRESSED STOCK IN THE MANUFACTURE OF BOARDS OF MATERIAL

(75) Inventors: Horst Muegge, Reichelsheim (DE); Matthias Graf, Eppingen (DE); Ulf Könekamp, Karlsruhe (DE); Klaus Martin Baumgärtner, Fränkisch-Crumbach (DE)

(73) Assignees: Dieffenbacher GmbH + Co. KG, Eppingen (DE); Muegge Electronic GmbH, Reichelsheim (DE)

(*) Notice: Subject to any disclaimer, the term of this patent is extended or adjusted under 35 U.S.C. 154(b) by 30 days.

(21) Appl. No.: 10/304,052

(22) Filed: Nov. 26, 2002

(65) Prior Publication Data

US 2003/0226643 A1 Dec. 11, 2003

(30) Foreign Application Priority Data

Nov. 26, 2001 (DE) .......................................... 10157601

(51) Int. Cl.[7] ........................... H05B 6/72; H05B 6/78; H03B 15/34

(52) U.S. Cl. ....................... 219/700; 219/696; 219/701; 219/746; 219/748; 219/750; 156/379.6

(58) Field of Search ................................ 219/695–701, 219/746–751, 756, 762; 156/379.6, 583.1, 583.7

(56) References Cited

U.S. PATENT DOCUMENTS

| | | | | | |
|---|---|---|---|---|---|
| 3,102,181 | A | * | 8/1963 | Verstraten | 219/693 |
| 3,851,132 | A | * | 11/1974 | VanKoughnett | 219/693 |
| 4,904,835 | A | * | 2/1990 | Koch et al. | 219/701 |
| 5,756,975 | A | * | 5/1998 | Harris et al. | 219/696 |
| 5,895,546 | A | | 4/1999 | Bielfeldt et al. | |
| 5,942,079 | A | | 8/1999 | Bielfeldt et al. | |
| 6,176,951 | B1 | | 1/2001 | Bielfeldt et al. | |
| 6,290,809 | B1 | | 9/2001 | Bielfeldt et al. | |
| 6,402,877 | B1 | | 6/2002 | Bielfeldt | |

FOREIGN PATENT DOCUMENTS

| | | | |
|---|---|---|---|
| DE | 196 27 024 | A1 | 1/1998 |
| DE | 197 18 772 | A1 | 11/1998 |

* cited by examiner

*Primary Examiner*—Philip H. Leung
(74) *Attorney, Agent, or Firm*—Foley & Lardner LLP

(57) ABSTRACT

An apparatus for the heating of pressed stock in the manufacture of boards of material or in the manufacture of veneer panels. The apparatus includes a microwave preheating device having rod antennae disposed in series, reflective shields, and a heating cell configured as a continuous oven in which the introduction of microwaves into the pressed stock takes place via the rod antennae. The rod antennae are attached to lie horizontally and transversely to the direction of production above, below, or above and below the pressed stock within the heating cell. The reflective surfaces are assigned to the rod antennae on the opposite sides of the pressed stock.

13 Claims, 5 Drawing Sheets

APPARATUS FOR THE HEATING OF PRESSED STOCK IN THE MANUFACTURE OF BOARDS OF MATERIAL

BACKGROUND

The present invention relates to an apparatus for the heating of pressed stock in the manufacture of boards of material or wood-based material or in the manufacture of veneer panels. One form of the apparatus from which the present invention sets out includes a microwave preheating device emitting microwave energy. The pressed stock, being preheatable by means of such a device, is capable of being pressed and cured after transfer into a single-platen or multi-platen press or into a continuously operating press with the application of pressure and heat.

Examples of such an apparatus for the manufacture of boards of wood-based material are the subject of U.S. Pat. No. 6,176,951, filed May 4, 1998; U.S. Pat. No. 6,290,809, filed Jul. 1, 1999; and U.S. Pat. No. 6,402,877, filed Aug. 9, 1999, which are hearby incorporated by reference. Examples of such an apparatus for the manufacture of veneer panels are the subject of U.S. Pat. No. 5,895,546, filed Apr. 9, 1997, and U.S. Pat. No. 5,942,079, filed Aug. 19, 1998, which are hereby incorporated by reference. Such apparatuses have already been used successfully in the industry for a considerable time for the preheating of the pressed stock (in mat or extruded form) by means of microwaves.

This technology has proven its value, in particular, in methods for the manufacture of very thick boards of wood-based material, as for example, in the manufacture of wood veneer panels, which are today manufactured in thicknesses of up to 150 mm and which could not be manufactured economically without a preheating device. The microwave preheating units used in such cases are, for the most part, industrially produced microwave heaters of conventional design, which are configured as continuous ovens. Since, in the manufacture of boards of wood-based material, the board width is many times greater than the board thickness, the microwaves are emitted perpendicularly to the plane of the board of wood-based material. The board widths are customarily between 1200 and 3900 mm and the board thicknesses in the region of from 30 to 150 mm. The microwaves are generated in what are known as microwave generators in which the high-frequency modulation and the magnetron tubes are accommodated. Because of the high microwave output required, a large number of generators are necessary for one preheating device, most of them possessing an output of 75–100 kW and being accommodated in enclosed electrical switch rooms adjacent to the production plant. From there, the microwaves generated are guided by means of hollow waveguides to the actual heating cell in the production plant, one hollow waveguide being necessary for each generator. In order to achieve the most uniform possible distribution of heat in the pressed stock passing through, the microwaves guided in the hollow waveguides, coming from the individual generators, are further branched, and the number of energy-conducting hollow waveguides is thus multiplied, so that a dense grid of introduction points can be achieved below and above the heating cell. The customary branching ratio today is 1 to 2 or 1 to 4, meaning that energy arriving from four generators, which is initially conducted in four hollow waveguides, is subdivided over up to 16 hollow waveguides, which lead to 16 introduction points. The microwaves are introduced into the heating cell by means of circular hollow waveguides, which are attached in a vertical standing position below and above the heating cell. Instrumentation whereby the phase relation of the microwave is tuned is necessary for every introduction point. Depending on the breadth of production of the plant for the manufacture of boards of wood-based material, between 12 and 36 introduction points are necessary to achieve a distribution of energy that is sufficiently homogeneous.

The capital outlay for such a microwave preheating device is very high, and the device has therefore hitherto become established only in plants for the manufacture of wood veneer panels.

One object of the present invention is to provide an apparatus for the heating, especially the preheating, of pressed stock by means of microwave energy whereby the capital costs of an equivalent plant can be reduced, plant availability can be increased, and the control expense can be reduced.

SUMMARY OF THE INVENTION

According to the present invention, one solution to the problem includes a microwave preheating device that consists of a heating cell configured as a continuous oven in which the introduction of the microwaves into the pressed stock takes place via rod antennae disposed in series and having reflection shields. The rod antennae are attached to lie horizontally and transversely to the direction of production above and/or below the pressed stock within the heating cell, and reflective surfaces are assigned to the rod antennae on, in each case, the opposite surfaces of the pressed stock.

The solution according to the present invention has resulted in a microwave preheating device of fundamentally different design, whereby the capital costs for an equivalent apparatus can be reduced by approximately 30–50%. Further advantages include minimization of the control expense and, consequently, less fault-prone components and increased plant availability.

According to one embodiment of the present invention, a heating cell is provided in which the introduction of the microwaves takes place, not via connected hollow waveguides which stand perpendicularly to the product plane, but via rod-shaped conductors (antennae), which are attached to lie horizontally and transversely to the direction of production, respectively, above and below the pressed stock in mat or extruded form within the heating cell. The introduction of the microwaves can also take place by means of hollow waveguides from the generators to the heating cell, the radiation characteristic of the rod antenna generally meaning that no additional branching of the hollow waveguides coming from the generators is necessary. In other words, the number of introduction points is equal to the number of generators. Purpose-developed hollow waveguide transitions are used for the transition from hollow waveguide to rod antenna.

Radiation takes place radially in all directions. There is a linear decline in output over the length of the rod antenna, the gradient of which is dependent upon the loss factor of the pressed stock to be preheated and the distance between the antenna and the product. In order to compensate for the resulting non-uniform heating over the width of the mat of pressed stock, it is one subject of the invention that two rod antennae, or a multiple of two, are disposed in series, introduction taking place alternately from the left and from the right. This makes it possible, as a result of the superposition of the heating profiles of the individual rod antennae, which heating profiles decline in a linear manner over the width, for uniform heating to be achieved in sum over the width of the pressed stock. Furthermore, it is also possible to make a connection to the rod antenna on both sides, meaning that both the left-hand and the right-hand side of each rod antenna are connected to a hollow waveguide. As long as the two connections are not fed from a single source, no interference arises here that might have a disruptive effect.

Reflective surfaces lying in opposite positions below the mat of pressed stock are assigned to the rod antennae that lie above it. The microwaves remaining after the first passage through the mat of pressed stock are reflected thereby and pass through the mat of pressed stock for a second time. Because the positioning of the reflective surface is matched to the position of the mat of pressed stock by the wavelength, it is possible, as a result, in connection with a selective adaptation of the phase relation of the microwave introduced, to bring about phase superposition and hence the formation of a standing wave, which stands vertically and perpendicularly to the plane of the pressed stock, the maxima of the standing wave lying in the center of the mat of pressed stock. A reflector shield is likewise attached above the horizontal rod antennae and conducts the microwaves radiated radially upward by the rod antenna downward to the pressed stock. As a result of the manual or motor-driven vertical adjustment of the lower reflective surface, the position of the maxima can be ideally focused on the center of the respective mat of pressed stock.

In the embodiment of the microwave heating cell according to the invention, a standing wave forms axially over the length of the rod antenna and results in more or less markedly non-uniform heating in the form of an undulating temperature profile. A negative effect of this phenomenon is advantageously avoided, by means of the invention, by the fact that the standing waves of consecutive rod antennae are offset laterally relative to one another by ¼ of the wavelength, and the minima and maxima are thus superposed and cancel each other out. To influence the phase relation of the standing wave, sleeves that can be introduced more or less deeply at the side wall at which the rod antenna penetrates the heating cell are inverted over the rod antenna, and, as it were, a coaxial waveguide is produced over a defined length together with the rod antenna. The phase relation can thus be shifted with the position of the transition from coaxial waveguide to rod antenna by axial displacement of the sleeve. The covering sleeves may also be adapted to different format widths of the board of wood-based material to be manufactured in order to adapt the radiation characteristic.

As a result of the small number of introduction points (=rod antennae), which is preferably equal to the number of microwave generators, it is advantageously also possible in the context of the invention to seat the microwave generators directly on the heating cell. Only the high-frequency electrical components would remain in separate switch cabinets. Thus, the energy feed to the heating cell can be provided by electrical cables, and only very short hollow waveguides are still needed between the microwave generators and the rod antenna. This alternative embodiment results in a further reduction of the capital costs.

BRIEF DESCRIPTION OF THE DRAWINGS

These and other features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings.

Figure 1:
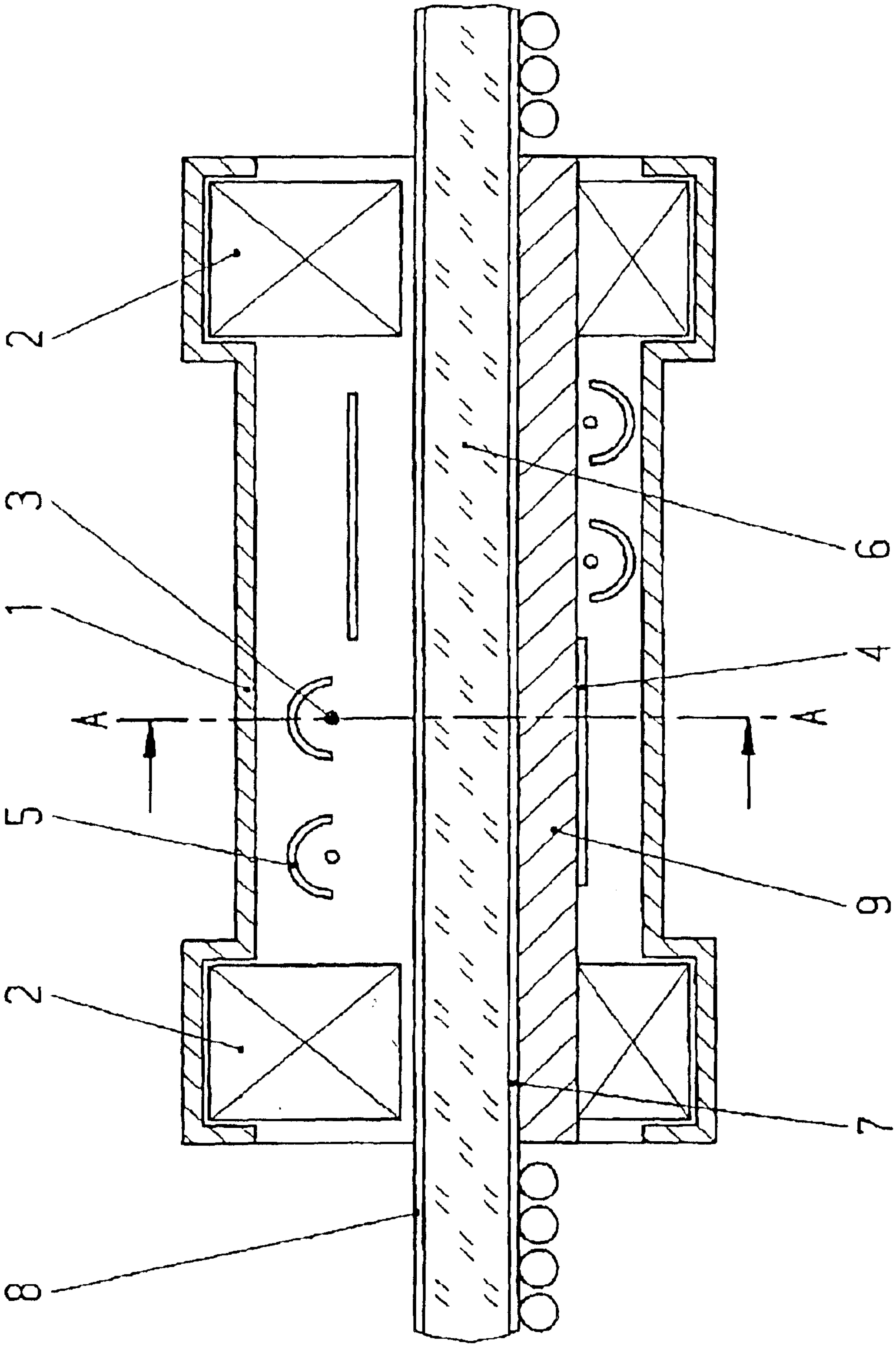
FIG. 1 is a sectional view taken along the line B—B of FIG. 2 showing the apparatus according to the present invention in a lateral view with rod antennae disposed transversely over the pressed stock.
Figure 2:
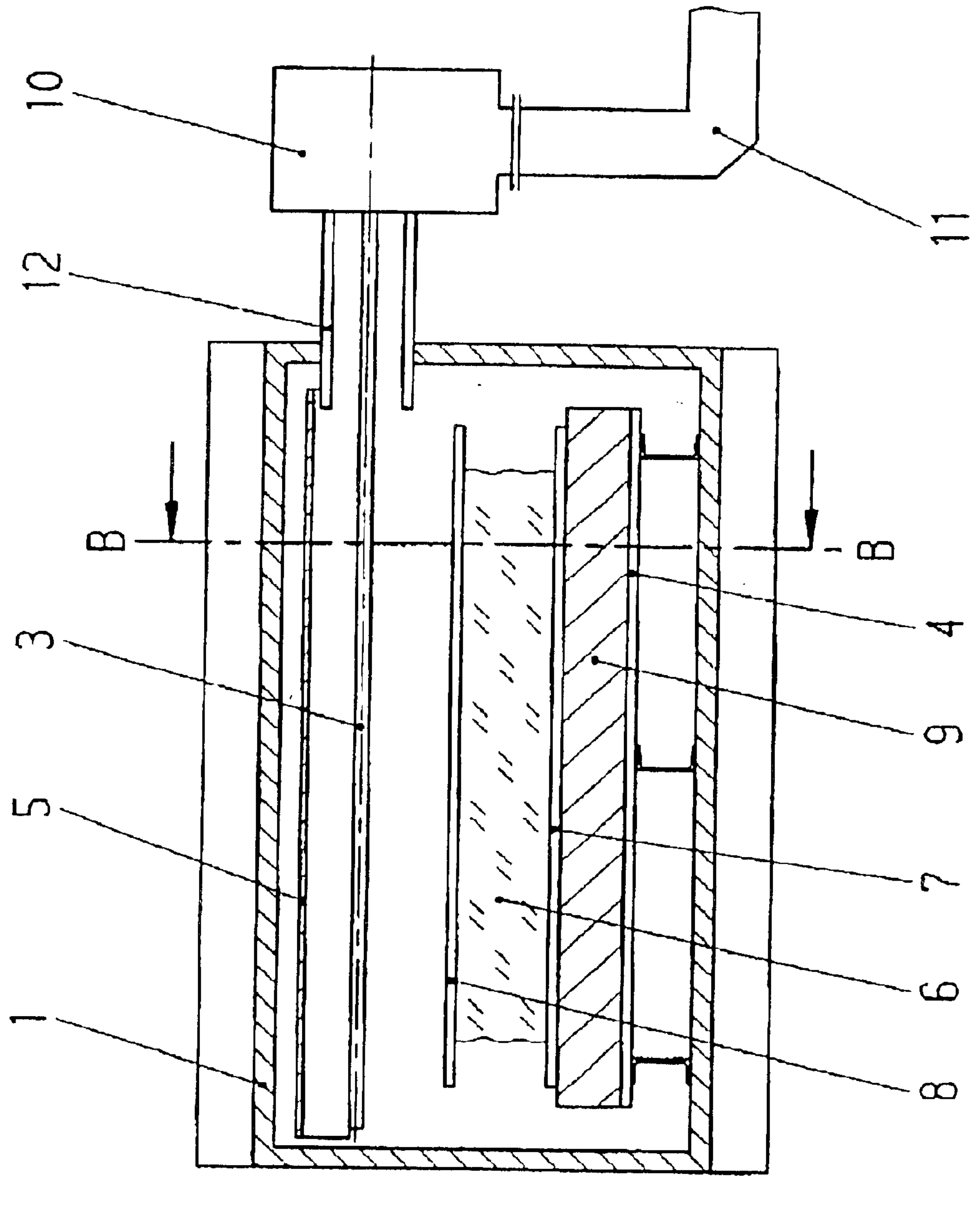
FIG. 2 is a sectional view taken along the line A—A of FIG. 1 showing the apparatus of the present invention in a front view with microwave energy being introduced on one side.

In one embodiment of the present invention, shown in FIGS. 1-2, the main components of the apparatus include the heating cell 1, configured as a continuous oven, the shielding devices 2 disposed on the charging and discharging sides of the pressed stock 6, with rod antennae 3, having reflector shields 5, disposed two above and two below the pressed stock 6 moved by the conveyor belt 7, and the reflective surfaces 4 assigned to the rod antennae 3 on, in each case, the opposite side of the pressed stock. The pressed stock 6 is passed by means of the conveyor belt 7 over a microwave-permeable support table 9 and held down by a covering belt 8, the two belts 7 and 8 consisting of plastic. In FIG. 2 the microwave energy is introduced into the rod antennae 3 on one side.

Figure 3:
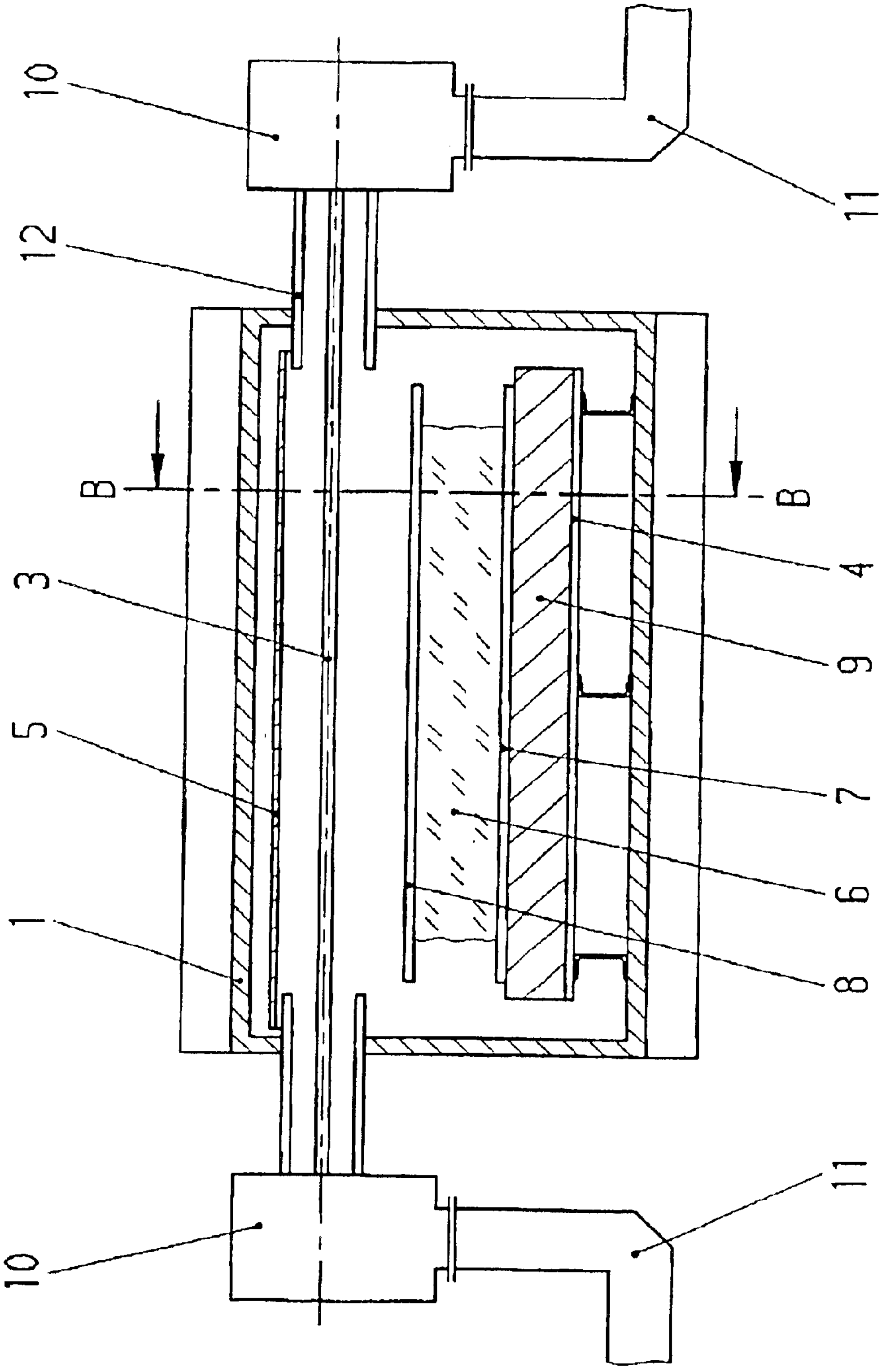
FIG. 3 shows the apparatus in accordance with FIG. 2 with microwave energy being introduced on both sides.

In another embodiment of the present invention, shown in FIG. 3, the microwave energy is introduced into the rod antennae 3 from both sides via the hollow waveguides 11 and the hollow waveguide transitions 10. The radiation characteristic of the rod antennae 3 with double-sided introduction upward into the pressed stock 6 is shown in FIG. 4.

Figure 4:
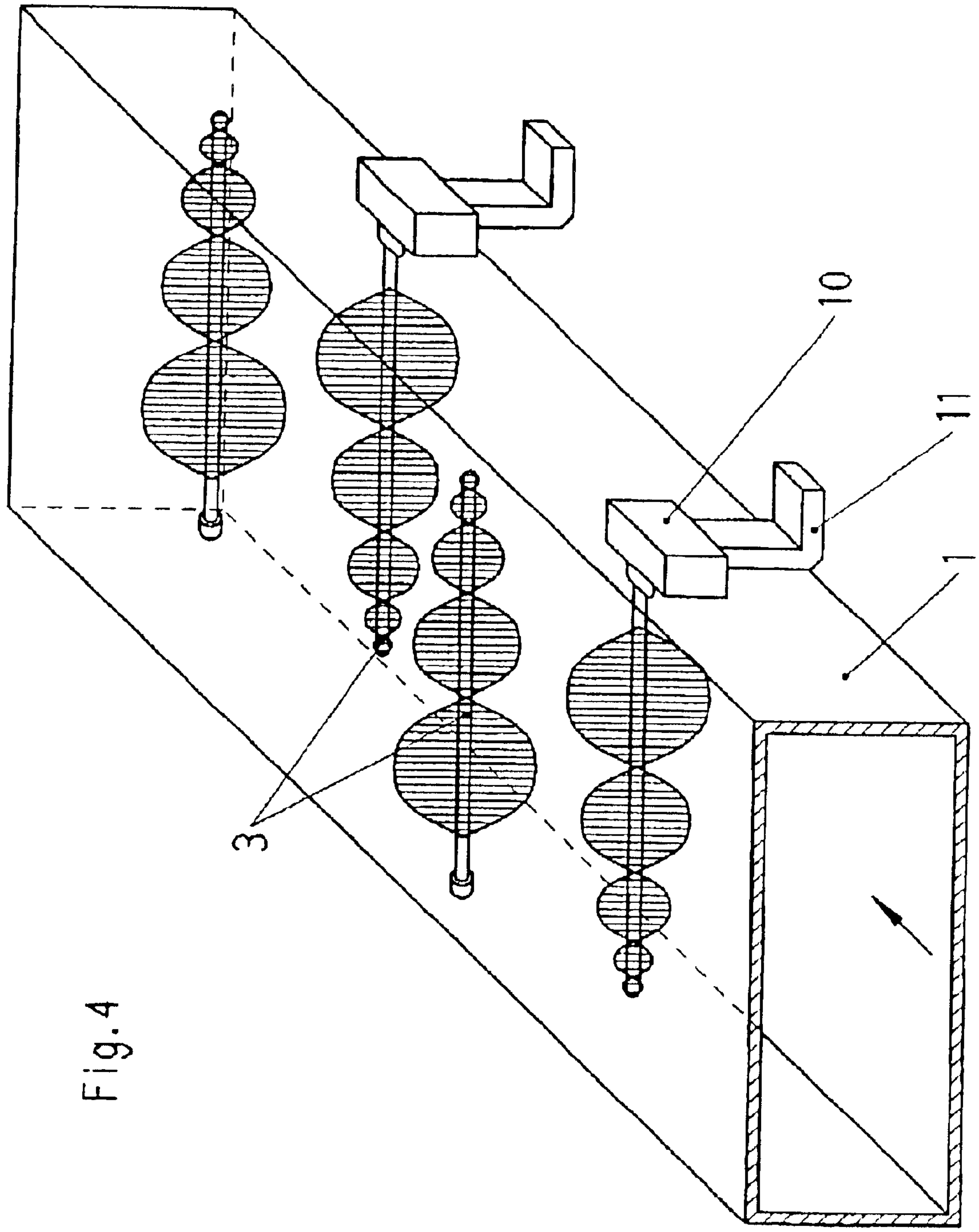
FIG. 4 shows the radiation characteristic of the rod antennae.
Figure 5:
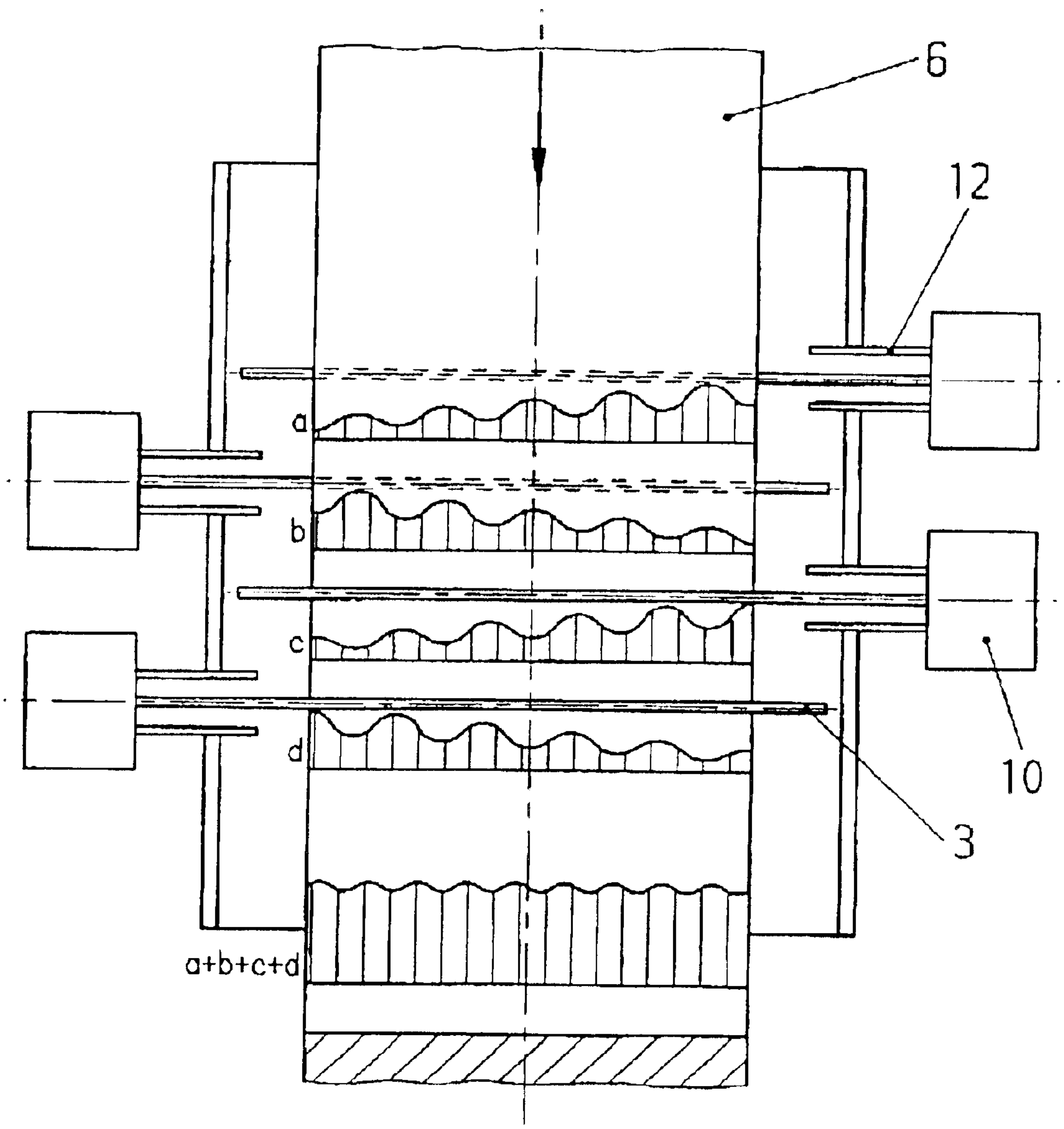
FIG. 5 shows the position of the rod antennae in accordance with FIG. 3 with the heating profile of the rod antennae on the pressed stock.

The heating profile of the rod antenna 3 in accordance with FIG. 4 is shown in FIG. 5 in a plan view of the pressed stock 6. In this case, the sleeves 12, which can be pushed by different distances over the rod antennae 3 to influence the phase relation of the standing waves, are shown.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

The priority document here, German patent application DE 101 57 601.3, filed Nov. 26, 2001, is hereby incorporated by reference.

What is claimed is:

1. An apparatus for heating pressed stock in the manufacture of boards of material or in the manufacture of veneer panels comprising:

rod antennae disposed in series and having reflective shields; and a heating cell configured as a continuous oven in which an introduction of microwaves into the pressed stock takes place via the rod antennae, wherein the rod antennae lie horizontally and transversely to a direction of production above, below, or above and below the pressed stock within the heating cell, and wherein reflective surfaces are assigned to the rod antennae on a side of the pressed stock opposite the rod antennae.

2. The apparatus according to claim 1, wherein one or more rod antennae with their reflective surfaces are consecutively disposed above and below the pressed stock.

3. The apparatus according to claim 1, further comprising hollow waveguides for introducing microwaves from generators to the heating cell.

4. The apparatus according to claim 3, further comprising hollow waveguide transitions for the transition from the hollow waveguides to the rod antennae.

5. The apparatus according to claim 1, wherein the rod antennae are configured so that microwave energy can be alternately introduced into the rod antennae from left and right.

6. The apparatus according to claim 1, further comprising a manual or motor-driven vertical adjustment system for the reflective surfaces, the rod antennae, or the reflective surfaces and the rod antennae for focusing microwave energy maxima in the center of the pressed stock.

7. The apparatus according to claim 6, wherein the vertical adjustment system is configured such that vertical adjustment of the layers of pressed stock in the heating cell takes place manually or by means of a motor drive in order to focus the microwave energy maxima in the center of the pressed stock.

8. The apparatus according to claim 6, wherein the vertical adjustment system is configured so that focusing of a microwave energy maximum within the thickness of the pressed stock can be set.

9. The apparatus according to claim 1, wherein the rod antennae are configured so that microwaves are introduced into the pressed stock via multiples of two rod antennae having reflective shields and arranged in series.

10. The apparatus according to claim 1, wherein the rod antennae are configured so that standing waves of consecutive rod antennae are offset laterally relative to one another.

11. The apparatus according to claim 1, further comprising suitable tuning elements for offsetting standing waves of consecutive rod antennae.

12. The apparatus according to claim 11, further comprising sleeves for tuning standing waves of consecutive rod antennae, wherein the sleeves can be introduced more or less deeply at a side wall at which the rod antenna penetrates the heating cell, and wherein the sleeves are inverted over the rod antennae.

13. The apparatus according to claim 1, further comprising microwave generators that are seated and attached directly on the heating cell.

* * * * *